(12) United States Patent
Chau et al.

(10) Patent No.: US 7,101,761 B2
(45) Date of Patent: Sep. 5, 2006

(54) METHOD OF FABRICATING SEMICONDUCTOR DEVICES WITH REPLACEMENT, COAXIAL GATE STRUCTURE

(75) Inventors: Robert S. Chau, Beaverton, OR (US); Scott A. Hareland, Lino Lakes, MN (US); Justin K. Brask, Portland, OR (US); Matthew V. Metz, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/746,323

(22) Filed: Dec. 23, 2003

(65) Prior Publication Data

US 2005/0136585 A1 Jun. 23, 2005

(51) Int. Cl.
 *H01L 21/336* (2006.01)
(52) U.S. Cl. ...................... 438/283; 977/848
(58) Field of Classification Search ............... 438/283; 977/848
 See application file for complete search history.

(56) References Cited

U.S. PATENT DOCUMENTS

| | | | | |
|---|---|---|---|---|
| 5,646,058 A | * | 7/1997 | Taur et al. ................ | 438/283 |
| 6,597,090 B1 | * | 7/2003 | Mancevski ................ | 313/309 |
| 6,784,028 B1 | * | 8/2004 | Rueckes et al. ............ | 438/128 |
| 6,858,478 B1 | * | 2/2005 | Chau et al. ................ | 438/149 |
| 6,897,098 B1 | * | 5/2005 | Hareland et al. ........... | 438/128 |
| 2003/0006410 A1 | * | 1/2003 | Doyle ......................... | 257/20 |
| 2005/0006671 A1 | * | 1/2005 | Heath et al. ................ | 257/211 |
| 2005/0037547 A1 | * | 2/2005 | Bertin et al. ................ | 438/142 |

OTHER PUBLICATIONS

Gordon, R.G.; Hausmann, D.; Kim, E.; Shepard, J., "A Kinetic Model for Step Coverage by Atomic Layer Deposition in Narrow Holes or Trenches," Chem. Vap. Deposition, 9, No. 2, 2003, pp. 73-78.

* cited by examiner

*Primary Examiner*—W. David Coleman
(74) *Attorney, Agent, or Firm*—Blakely, Sokoloff, Taylor & Zafman LLP

(57) ABSTRACT

A method is described for providing a nanostructure suspended above a substrate surface. The method includes providing a nanostructure encased in an oxide shell on a substrate and depositing a sacrificial material and a support material over the oxide encased nanostructure. Then, the sacrificial material is removed to expose the oxide encased nanostructure. Once the oxide encased nanostructure has been exposed, the oxide shell is removed from the oxide encased nanostructure such that the nanostructure is suspended above the substrate surface.

16 Claims, 4 Drawing Sheets

METHOD OF FABRICATING SEMICONDUCTOR DEVICES WITH REPLACEMENT, COAXIAL GATE STRUCTURE

BACKGROUND

1. Field

Embodiments relate generally to fabrication of semiconductor devices, and more particularly to a method of fabricating a transistor structure in which a gate dielectric layer surrounds a channel on more than one side thereof.

2. Background

A variety of multiple-gate transistors have been proposed. For example, FIG. 10 shows a tri-gate structure 200, in which a gate dielectric layer (e.g., oxide layer) 220 surrounds a channel 250 on three sides, yielding control of two vertical surface regions and horizontal layer region of the channel adjacent to the gate dielectric layer 220. In certain cases, multiple-gate transistors may be desirable since transistor performance can be improved by increasing an amount of area that gate dielectric layer is in contact with a channel of a transistor structure.

In the field of semiconductor device fabrication, replacement gate processes may be used for constructing transistors with a wide selection of gate materials. In a replacement gate flow process, an entire transistor may be fabricated with a sacrificial gate electrode and a sacrificial gate dielectric. After all of the high temperature fabrication processes have taken place, the sacrificial gate electrode and the sacrificial gate dielectric may be removed and a desired gate material, such as metal gate electrode, may be deposited.

BRIEF DESCRIPTION OF THE DRAWINGS

The invention is illustrated by way of example and not by way of limitation in the figures of the accompanying drawings in which like references indicate similar elements. It should be noted that the references to an or one embodiment of this disclosure are not necessarily to the same embodiment, and such references mean at least one.

DETAILED DESCRIPTION

In the following description, for purposes of explanation, specific details are set forth to provide a thorough understanding of embodiments. However, it is understood that embodiments may be practiced without these specific details. In other instances, well-known structures and techniques have not been shown in detail to avoid obscuring the understanding of this description.

Figure 1:
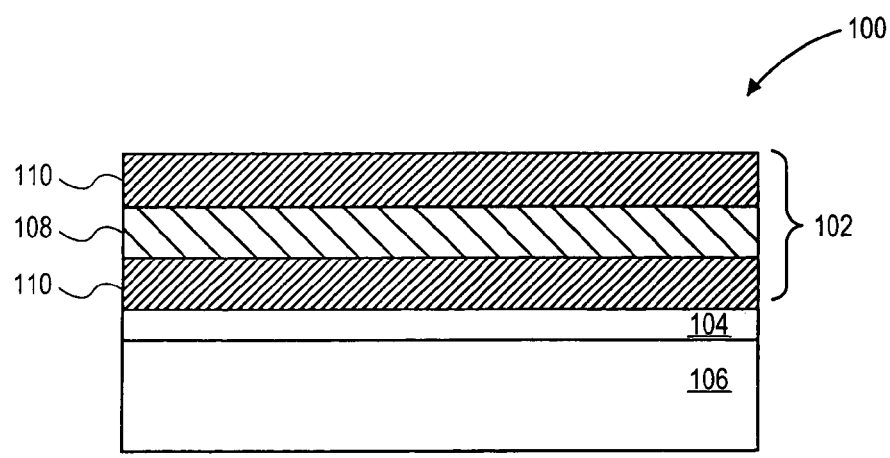
FIG. 1 shows a cross-sectional view of a portion of a nanostructure encased in an oxide shell and deposited on a substrate.

FIG. 1 shows an oxide-coated nanostructure 102 deposited on an insulating layer 104 on top of a semiconductor substrate 106. The oxide-coated nanostructure 102 may be fabricated in a number of ways. In one embodiment, the oxide-coated nanostructure 102 is fabricated by oxidizing an outer layer of the silicon nanowire structure to transform silicon to silicon-oxide 110. The oxidizing process consumes the outer layer of the nanostructure 108 (e.g., silicon nanowire) to form an oxide shell or an oxide coating 110. In one embodiment, the thickness of the remaining nanostructure 108 (e.g., silicon nanowire) may be selected by controlling an amount of outer layer 110 consumed by the oxidizing process. In one embodiment, the diameter of the remaining nanostructure 108 is less than 10 nanometers (nm). In another embodiment, the diameter of the remaining nanostructure 108 is less than 5 nm.

As used herein, the term nanostructure refers to any structure having a diameter less than about 50 nm, such as a nanowire or a nanotube. The term nanowire is used herein to describe any nanowires, including silicon nanowires. The term nanotube is used herein to describe any nanotubes, including single-walled or multiple-walled carbon nanotubes.

In one embodiment, the oxide coating or the oxide shell 110 on the nanostructure 108 is used to provide a sacrificial layer that is removed later in the process enabling gate materials to coaxially surround the nanostructure 108. In one embodiment, the nanostructure 108 is described herein as a silicon (Si) nanowire; however, the nanostructure may be fabricated from any suitable materials, including Germanium (Ge), Indium (In) and Gallium (Ga), or any combination of Si, Ge, In and Ga. Additionally, the embodiments of the invention are not limited to use of nanowire type structures but nanotube type structures (e.g., carbon nanotubes) may also be utilized.

Figure 2:
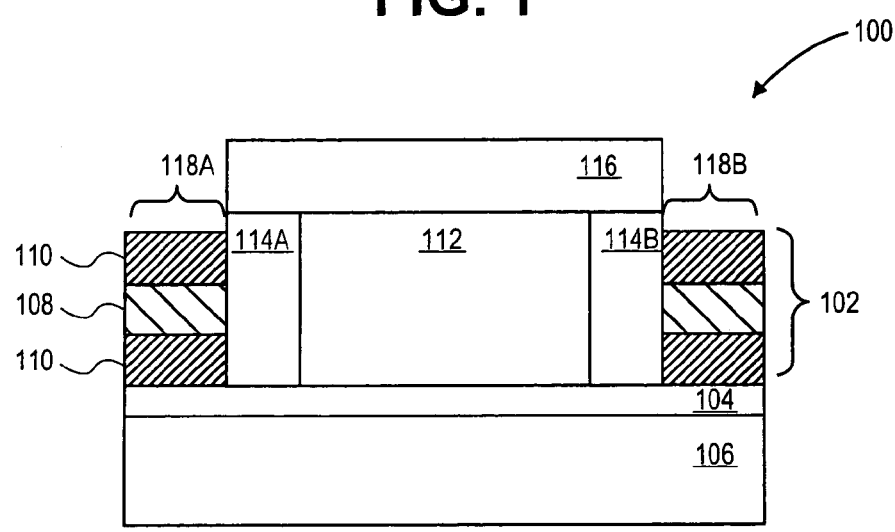
FIG. 2 shows a cross-sectional view of the structure of FIG. 1 after a sacrificial gate electrode and spacers are deposited on the nanostructure encased in the oxide shell.

FIG. 2 shows the structure 100 of FIG. 1 after a sacrificial gate electrode 112 is deposited over the oxide-coated nanostructure 102. Once the sacrificial gate electrode 112 has been deposited over the nanowire shell structure 102 and patterned, spacers 114A, 114B may be deposited to surround the sacrificial gate electrode 112 as shown in FIG. 2. In one embodiment, the sacrificial gate electrode 112 comprises polysilicon and the spacers 114A, 114B comprises silicon oxynitride. In one context, the term silicon oxynitride is used to describe a dielectric material containing silicon, oxygen and nitrogen. A layer of hardmask 116 may be deposited on top of the sacrificial gate electrode 112 and the spacers 114A, 114B. The hardmask layer 116 and the spacers 114A, 114B may be used to protect the nanostructure 102 disposed within the sacrificial gate electrode 112 during subsequent doping processes.

Figure 3:
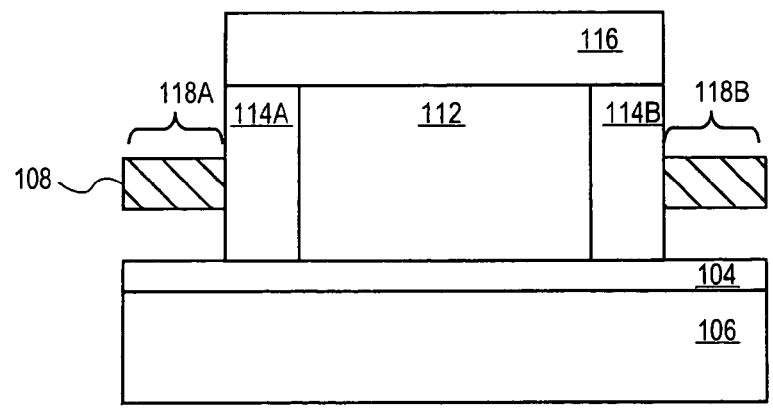
FIG. 3 shows a cross-sectional view of the structure of FIG. 2 after removing oxide shell from contact regions thereof.

FIG. 3 shows the structure 100 of FIG. 2 after removing the oxide shell 110 from selected regions 118A, 118B of the nanostructure 102. In one embodiment, the oxide shell 110 is removed from regions of the nanostructure 102, which may subsequently be used as contact regions for a transistor device. In the illustrated embodiment, the oxide shell 110 is removed from regions 118A, 118B of the nanostructure 102 that extend away from the spacers 114A, 114B and the sacrificial gate electrode 112. The oxide shell 110 disposed on the nanostructure 102 may be etched away using wet etching process. In one embodiment, hydrofluoric acid is used to selectively etch the oxide layer 110 without removing the silicon nanowire structure. Other etching process may also be used to selectively remove, the oxide layer 110, including dry etching process.

A variety of processing may occur in source/drain regions of structure 100 including implantation, solid-source diffusion, epitaxial growth and salicidation to reduce parasitic series resistance. It will be appreciated that tip, source/drain, and contact regions of the structure 100 may be processed without impacting a channel region (i.e., a portion of the nanostructure 108 disposed within the sacrificial gate electrode 112) since the channel region of the nanostructure is protected by the sacrificial gate electrode 112 and the hardmask layer 116.

In the illustrated embodiment, the oxide shell 110 is completed removed from the selected regions 118A, 118B of the nanostructure 102. In certain instances, it may be advantageous to remove only a portion of the oxide shell from the selected regions of the nanostructure. Accordingly, in one embodiment, the oxide shell is partially removed from the selected regions 118A, 118B of the nanostructure. For example, the oxide shell 110 from top portions of the selected regions 118A, 118B of the nanostructure may be selectively removed without removing the oxide shell from bottom portions of the nanostructure. The selective removal of the oxide shell from the top portion of the nanostructure may be accomplished using various etching processes, such as plasma etching process.

Figure 4:
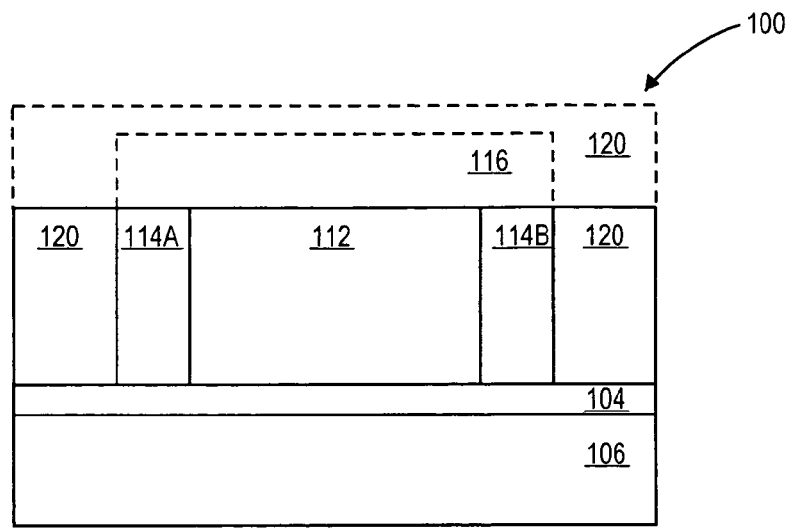
FIG. 4 shows a cross-sectional view of the structure of FIG. 3 after depositing an insulating material and polishing down the insulating material to expose the sacrificial gate electrode.

FIG. 4 shows the structure 100 of FIG. 3 after depositing an insulating material 120 and polishing down the insulating material to expose the sacrificial gate electrode 112. Specifically, insulating material 120, for example, interlayer dielectric (ILD) layer, is deposited to cover the hardmask layer 116. Additionally, the insulating material 120 is also deposited in the regions 118A, 118B adjacent to the spacers 114A, 114B such that the insulating material 120 surrounds the nanostructure 108 extending from the spacers. Once the insulating material 120 has been deposited, the insulating material 120 and the hardmask layer 116 are polished down to expose the sacrificial gate electrode 112. The insulating material 120 may be polished down using a chemical mechanical polishing process.

In one embodiment, the insulating material 120 has different etch characteristics than the oxide shell 110 formed on the nanostructure 108 to enable selective removal of the insulating material 120 without removing the oxide shell 110 from the oxide-coated nanostructure 102.

Figure 5:
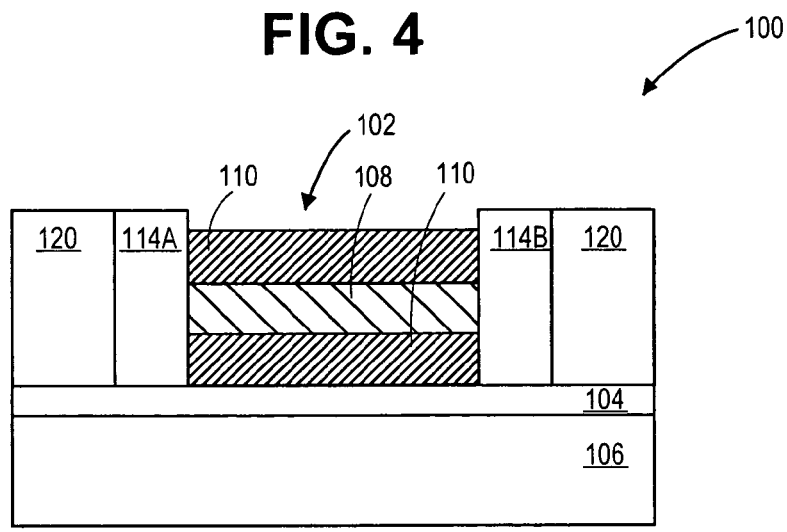
FIG. 5 shows a cross-sectional view of the structure of FIG. 4 after etching the sacrificial gate electrode to expose the oxide encased nanowire structure.

FIG. 5 shows the structure 100 of FIG. 4 after etching the sacrificial gate electrode 112 to expose the oxide-coated nanostructure 102 disposed between the spacers 114A, 114B. The sacrificial gate electrode 112 may be removed using a suitable etching process. For example, if the sacrificial gate electrode 112 is made of polysilicon, it may be removed with a variety of hydroxide-based solutions. However, for high selectivity, for example, to stop on ultra-thin spacers and on oxide insulating layers or oxide-shell coatings with physical thickness as thin as 5 Angstroms, relatively mild processing conditions are employed. One way is treatment with an aqueous ammonium hydroxide solution in the concentration range 5–15% by volume at $25_i$ C to which a sonication transducer dissipates ultra- or mega-sonic energy with a power of 0.5 to 5 W/cm$^2$.

Figure 6:
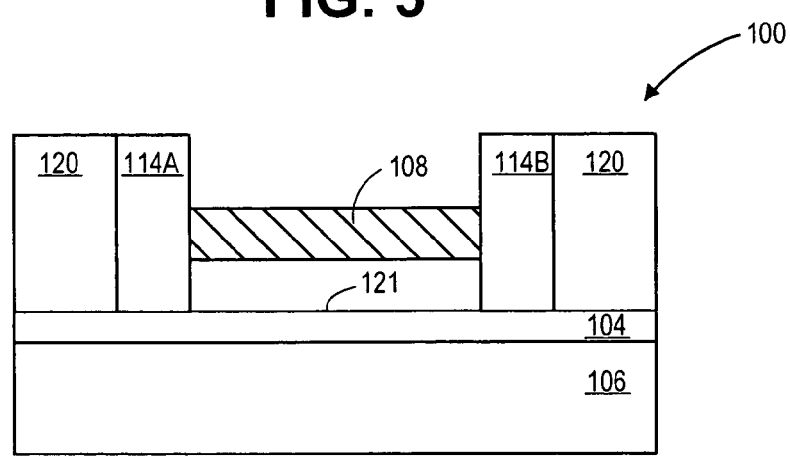
FIG. 6 shows a cross-sectional view of the structure of FIG. 5 after removing oxide shell to expose the nanostructure, which is suspended above the substrate surface.

FIG. 6 shows the structure 100 of FIG. 5 after removing the oxide shell 110 to expose the nanostructure 108. By doing so, the nanostructure 108 becomes suspended above a surface 121 of the substrate 106 and is held in place by the spacers 114A, 114B and other materials in contact with the nanostructure 108. In one embodiment, the exposed nanostructure 108 extending between the spacers 114A, 114B serve as a channel of a transistor device.

In one embodiment, a method is described of providing a nanostructure suspended a defined distance above a substrate surface, as illustrated in FIGS. 1 through 6. The method includes providing a nanostructure encased within a sacrificial layer on a substrate and forming first and second support structures over the encased nanostructure. Then, the sacrificial layer is selectively removed such that the nanostructure is suspended above a surface of the substrate between the first and second support structure.

In one embodiment, the nanostructure, suspended above the substrate serves as a channel for a transistor device. As a part of a process for fabricating a transistor device, gate dielectric material and gate electrode material may be deposited on the suspended nanostructure such that a layer of gate dielectric and a layer of gate electrode coaxially surround the nanostructure. In one embodiment, a channel of a transistor device is formed using a suitable nanowire structure, such as silicon nanowires. In another embodiment, a channel of a transistor device is formed using a suitable nanotube structure, such as single-walled carbon nanotube (SWCN) and double-walled carbon nanotube (DWCN). The process of deposing gate dielectric and gate electrode material will be discussed in more detail with reference to FIGS. 7 and 8.

Figure 7:
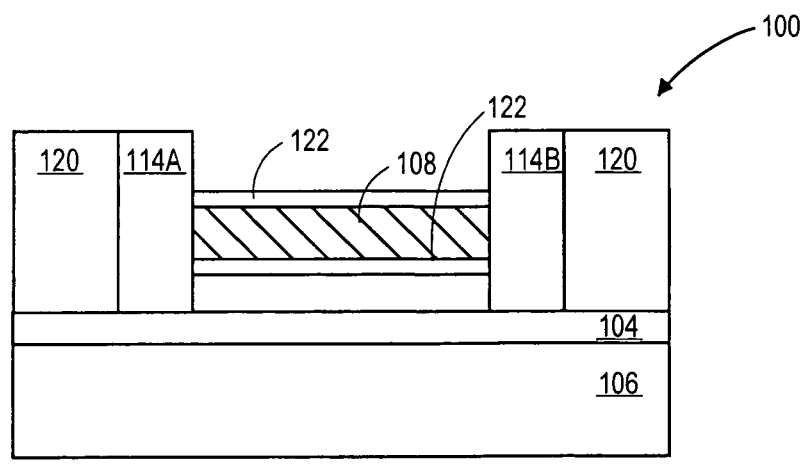
FIG. 7 shows a cross-sectional view of the structure of FIG. 6 after deposition of a gate dielectric material on the nanostructure.

FIG. 7 shows the structure 100 of FIG. 6 after deposition of a gate dielectric 122 on the nanostructure 108. In one embodiment, the gate dielectric 122 comprises a high-k dielectric material having a dielectric constant greater than silicon dioxide. In one embodiment, atomic layer deposition (ALD) process is used to deposit the gate dielectric 122 on the nanostructure 108. Specifically, ALD process may be used to form a film of gate dielectric material on the nanostructure 108 by alternately exposing the nanostructure to a first precursor and a second precursor. Each precursor exposure provides an additional atomic layer of gate dielectric to previously deposited layers. The exposure to the first and second precursors may be repeated to form a gate dielectric of a desired film thickness. One advantage of using ALD process in forming the gate dielectric is that the ALD is capable of uniformly covering the nanostructure 108, including the bottom region thereof. Another advantage of using ALD process in forming the gate dielectric is that the thickness of the gate dielectric may be accurately controlled.

By coaxially surrounding the nanostructure 108 with gate dielectric material 122, an amount of area that the gate dielectric layer 122 is in contact with the channel region of the transistor device is increased or maximized and thereby improving certain performance aspects of the transistor. Other conformal deposition process may be used to deposit a gate dielectric material 122 on the nanostructure 108, such as chemical vapor deposition (CVD).

Figure 8:
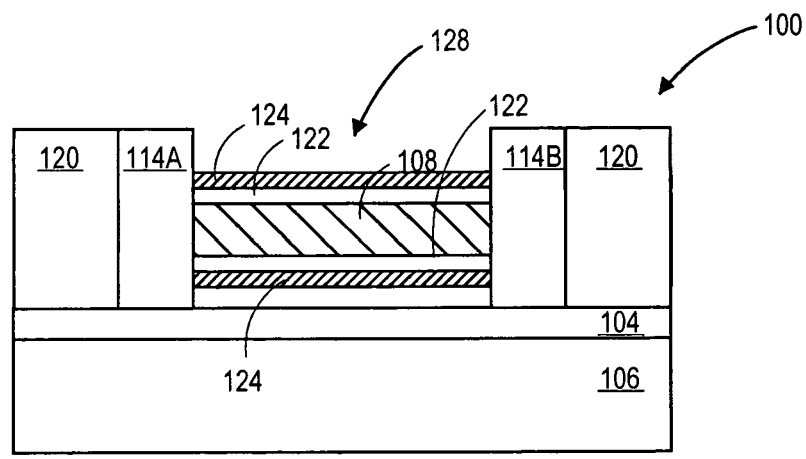
FIG. 8 shows a cross-sectional view of the structure of FIG. 7 after deposition of a metal gate electrode on the nanostructure.

FIG. 8 shows the structure 100 of FIG. 7 after deposition of gate electrode 124 over the gate dielectric 122. In one embodiment, the gate electrode 124 is formed using a metal gate electrode material. In one embodiment, the metal gate electrode 124 is deposited over the dielectric layer 122 using ALD process. By using ALD process, the metal gate electrode 124 may be uniformly coated onto the dielectric layer 122 to a desired thickness. In another embodiment, other conformal deposition technique is used to deposit metal gate electrodes 124 on the nanostructure 108, such as chemical vapor deposition (CVD).

In one context, the term metal gate electrode is used to refer to a gate or other metal structure in a transistor or other semiconductor device formed of a metal or an alloy. In one embodiment, the combined thickness of the gate dielectric 122 and the gate electrode 124 is in a range from about 3 to 8 nm. In another embodiment, the combined thickness of the gate dielectric 122 and the gate electrode 124 is in a range from 4 to 6 nm, preferably about 5 nm. Although the gate electrode is described herein in terms of a metal gate electrode, it should be noted that polysilicon gate electrode may also be utilized with embodiments of the invention. It should also be noted that the metal gate electrode 124 may be deposited directly on the nanostructure without depositing gate dielectric material between the nanostructure and the gate electrode.

As illustrated in FIGS. 7 and 8, the nanostructure suspended above a substrate surface is used to fabricate a transistor device having a coaxial gate structure. The coaxial gate structure, fabricated in accordance with embodiments of the invention, may provide a greater gate control than conventional transistor devices. This is because, in the coaxial gate structure, an amount of area that gate dielectric layer is actually in contact with a channel region may be greater than conventional gate structures. In one embodiment, the coaxial gate structure is fabricated using a replacement gate flow process, which is compatible with high-k dielectrics and metal gate electrodes. Generally, in a replacement gate flow process, portions of a transistor is fabricated with a sacrificial gate electrode and possibly a sacrificial gate dielectric. After all of the high temperature fabrication processes have taken place, the sacrificial gate materials are removed and a desired gate material is deposited on the nanostructure, which is suspended above a surface of a substrate.

Figure 9:
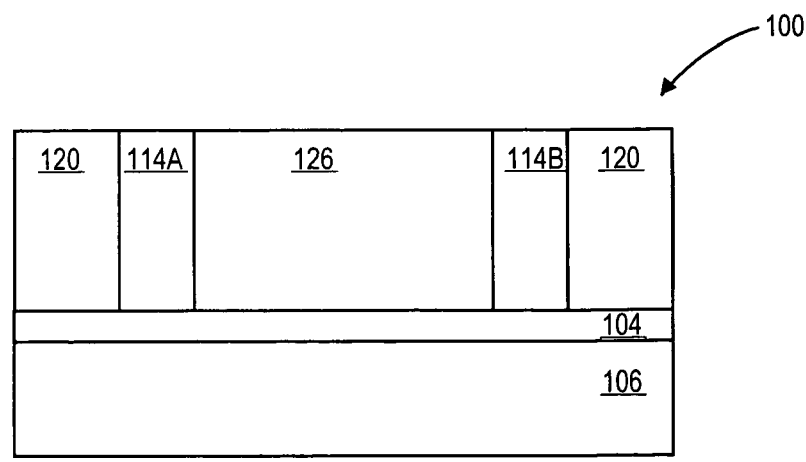
FIG. 9 shows a cross-sectional view of the structure of FIG. 8 after filling the remainder of the trench with a metal.
Figure 10:
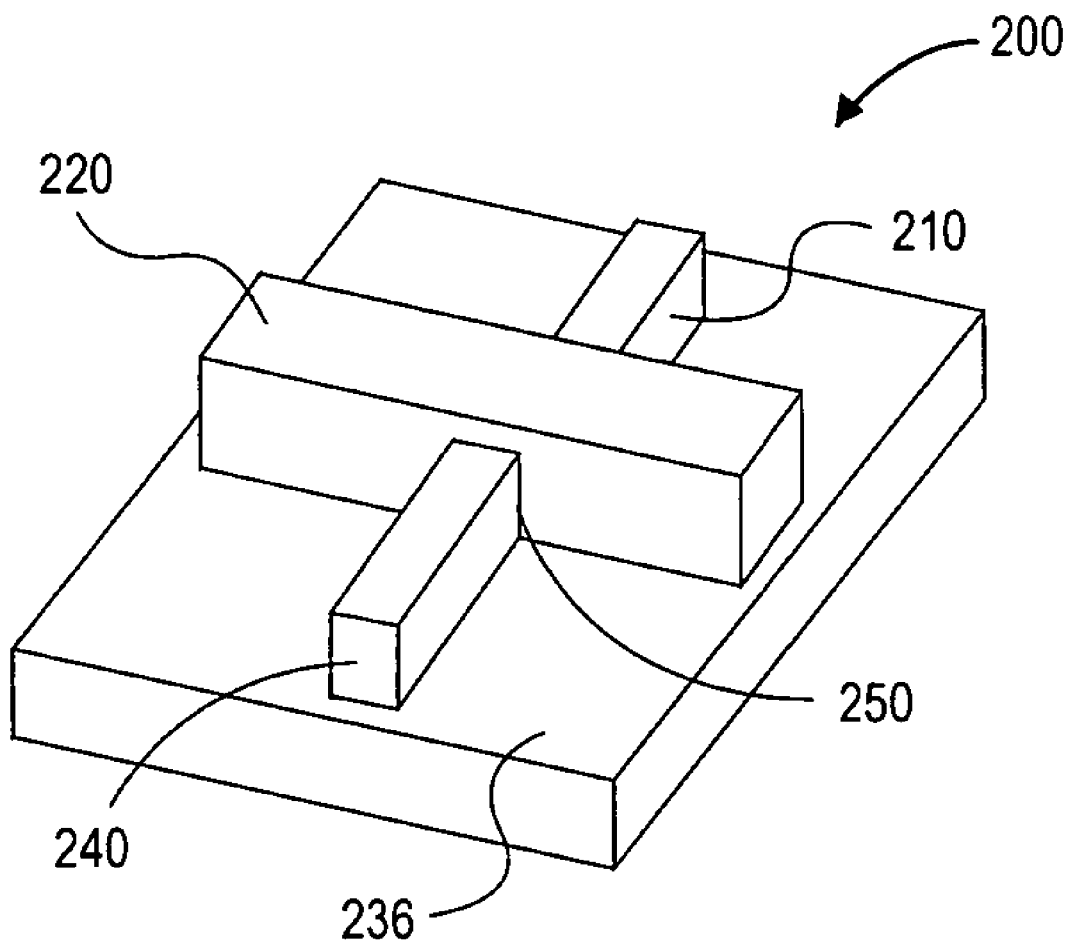
FIG. 10 shows a diagrammatic perspective view of a tri-gate structure.

FIG. 9 shows the structure 100 of FIG. 8 after filling the remainder of the trench 128 formed between the spacers 114A, 114B with a metal filler 126. In one embodiment, the metal filler 126 used to fill the trench 128 is a low-resistance metal to enable contact with the gate electrode 124. In this regard, the metal filler 126 deposited in the trench 128 may be used to establish electrical contact between the gate electrode 124 and metal interconnect layers which may patterned during subsequent processing. The metal filler 126 may be selected from a group consisting of tungsten, aluminum or other metal material that is suitable for filling a space. For example, once the process of filling the trench 128 with the metal filler 126 is completed, subsequent process may be performed, such as depositing additional insulating layers and fabricating contacts and interconnect layers between the insulating layers.

The structure 100 constructed according to the embodiments of the invention may be further processed as appropriate to fabricate a semiconductor device, such as a transistor device. In this regard, it should be noted that certain details of a transistor device, such as a drain and a source, have not been illustrated in the drawings in order to avoid obscuring the understanding of this description.

While several embodiments have been described, those skilled in the art will recognize that the invention is not limited to the embodiments described, but can be practiced with modification and alteration within the spirit and scope of the appended claims. The description is thus to be regarded as illustrative instead of limiting.

The invention claimed is:

1. A method comprising:
   providing a nanostructure covered on a substrate;
   oxidizing a first portion of the nanostructure to define a sacrificial layer between the substrate and a second portion of the nanostructure;
   forming a first support structure over the nanostructure;
   forming a second support structure over the nanostructure; and
   removing the sacrificial layer from the nanostructure such that second portion of the nanostructure is suspended a distance from a surface of the substrate between the first and second support structure.

2. The method of claim 1, wherein oxidizing a first portion of the manostructure comprises:
   placing a silicon nanowire structure on the substrate; and
   oxidizing an outer layer of the nanowire structure to transform silicon to silicon-oxide.

3. The method of claim 1, wherein, after removing the sacrificial layer, the second portion of the nanostructure is horizontally disposed a distance above a surface of the substrate, defined by a thickness of the sacrificial layer.

4. The method of claim 1, wherein the first and second support structures comprise silicon oxynitride spacers.

5. The method of claim 1, wherein the nanostructure comprises a nanowire structure.

6. The method of claim 5, wherein the nanowire structure comprises a material selected from a group consisting of Si, Ge, In and Ga, or combinations thereof.

7. The method of claim 1, wherein the nanostructure comprises a nanotube structure.

8. A method comprising:
   providing a nanostructure suspended a distance from a substrate surface; and
   depositing a gate material on the nanostructure.

9. The method of claim 8, wherein depositing a gate material on the nanostructure comprises:
   depositing a gate dielectric layer on the nanostructure such that the gate dielectric layer coaxially surrounds at least a portion of the nanostructure; and
   depositing a gate electrode layer over the gate dielectric layer such that the gate electrode coaxially surrounds at least a portion of the gate dielectric layer.

10. The method of claim 9, wherein a combined thickness of the gate dielectric layer and the gate electrode layer deposited on the nanostructure is in a range from about 3 to 8 nanometers.

11. The method of claim 8, wherein the gate material includes a metal gate electrode material.

12. The method of claim 8, wherein depositing a gate material on the nanostructure comprises:
   depositing a gate electrode layer directly on the nanostructure such that the gate dielectric layer coaxially surrounds at least a portion of the nanostructure.

13. The method of claim 8, wherein the nanostructure comprises a nanowire structure.

14. The method of claim 13, wherein the nanowire structure comprises a material selected from a group consisting of Si, Ge, In and Ga, or combinations thereof.

15. The method of claim 13, wherein providing the nanowire structure suspended above the substrate surface comprises:
   providing the nanowire structure encased in an oxide shell on a substrate;
   depositing a sacrificial gate electrode on the oxide encased nanowire structure;

removing the sacrificial gate electrode to expose the oxide encased nanowire structure; and removing the oxide shell from the oxide encased nanowire structure to expose the nanowire structure, which is suspended above the substrate surface.

16. The method of claim 8, wherein the nanostructure comprises a nanotube structure.

* * * * *